United States Patent
Xhafa et al.

(10) Patent No.: US 9,647,689 B2
(45) Date of Patent: May 9, 2017

(54) ROBUST CONNECTION FOR LOW-ENERGY WIRELESS NETWORKS

(71) Applicant: Texas Instruments Incorporated, Dallas, TX (US)

(72) Inventors: Ariton E. Xhafa, Plano, TX (US); Jing-Fei Ren, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 91 days.

(21) Appl. No.: 14/598,000

(22) Filed: Jan. 15, 2015

(65) Prior Publication Data

US 2016/0210189 A1     Jul. 21, 2016

(51) Int. Cl.
| | |
|---|---|
| *H03M 13/00* | (2006.01) |
| *H03M 13/09* | (2006.01) |
| *H04B 7/26* | (2006.01) |
| *H04L 1/08* | (2006.01) |
| *H04L 1/00* | (2006.01) |

(52) U.S. Cl.
CPC .............. *H03M 13/09* (2013.01); *H04B 7/26* (2013.01); *H04L 1/0061* (2013.01); *H04L 1/08* (2013.01)

(58) Field of Classification Search
CPC ... H04L 1/0061; H04L 1/1816; H04L 1/1819; H04L 1/08; G10L 19/005; G06F 11/1004; G06F 3/0619; H04B 7/26; H04B 2201/71346; H03M 13/09
See application file for complete search history.

(56) References Cited

U.S. PATENT DOCUMENTS

2014/0222420 A1* 8/2014 Su .................. G10L 19/005
704/201

OTHER PUBLICATIONS

Gomez et al., Overview and evaluation of Bluetooth low energy: AN emerging low power wireless technology, 2012, Sensors, pp. 11734 to 11753 (retrieved from google.com).*
Nieminen et al., Networking solutions for connecting bluetooth low energy enabled machines to the Internet of things, Nov. 2014, IEEE, pp. 83-90.*
Gomez et al., Modeling the maximum throughput of Bluetooth low energy in an error prone link, Nov. 2011, IEEE Comm. Letters, vol. 15, No. 11, pp. 1187-1189.*

* cited by examiner

*Primary Examiner* — Shelly A Chase
(74) *Attorney, Agent, or Firm* — John R. Pessetto; Charles A. Brill; Frank D. Cimino (57) ABSTRACT

A system and method for detecting and correcting bit errors in received packets is disclosed. The presence of bit errors in a received packet are detected using CRC bits carried in the received packet. One or more erroneous bits may be identified in a header of the packet. The erroneous bits are corrected by setting the erroneous bits to match the expected bit settings. The corrected packet is then error-checked using the CRC bits. Errors may be detected in two sequential packets where a second packet is a retransmission of a first packet. Differing bits are identified in the two sequential packets. A packet is modified to include additional combinations of the differing bits and then error-checked with each combination of the differing bits. If a modified packet passes error checking, then process the modified packet.

17 Claims, 3 Drawing Sheets

ROBUST CONNECTION FOR LOW-ENERGY WIRELESS NETWORKS

TECHNICAL FIELD

Embodiments of the invention are directed, in general, to communications between wireless devices and, more specifically, to correcting errors in packets transmitted between low-energy wireless devices.

BACKGROUND

Next-generation mobile devices will be able to access multiple wireless networks employing different technologies and protocols, such as WiMAX (IEEE 802.16), Wireless Local Area Network (WLAN) (e.g., IEEE 802.11 or WiFi), Long-Term Evolution (LTE), Wireless USB and/or Bluetooth. These wireless networks are distributed across a broad range of frequency bands. While the capability to access diverse network technologies benefits users and operators alike, interference between different technologies makes it difficult to simultaneously operate using different technologies.

For example, in the 2.4-2.5 frequency GHz band, WiFi (i.e., IEEE 802.11), Bluetooth (BT), Bluetooth Low Energy (BLE), and WiMAX networks all operate. The interference between these technologies creates challenges for the coexistence of multiple wireless interfaces. More specifically, out of band emissions by any of these technologies may saturate the receiver of the other technologies and, therefore, blocking may occur.

Due to the low power transmission in BLE and interference from other wireless networks operating on the same frequency band, BLE packets transmitted between a master and a slave may be in error. Consecutive packet errors may cause the master to drop the connection with the slave.

SUMMARY OF THE INVENTION

Embodiments of the invention address the problem of connection drops by a BLE master after consecutive packets are received in error. The performance for transmitted packets may be improved so as to reduce the likelihood of connection drops at the master.

In one embodiment, a device comprises a circuit for receiving signals from other devices using a Bluetooth low energy link layer, a memory for storing received packet parameters, and a processor adapted to perform operations on packets received from the other device. The device detects the presence of bit errors in a received packet using CRC bits carried in the received packet. The device then identifies one or more erroneous bits in a header of the packet. The one or more erroneous bits are identified as not matching expected bit settings established in a protocol standard or in previously received packets. The device corrects the one or more erroneous bits in the packet by setting the erroneous bits to match the expected bit settings and then error-check a corrected packet using the CRC bits. If the corrected packet passes the error checking, then the device processes the corrected packet. If the corrected packet fails to pass the error checking, then the device may request retransmission of the received packet from the remote device or may terminate a communication session with the other device.

In one embodiment, the erroneous bits are located in a reserved field of the header and the device set all bits in the reserved field to zero, one, or some other value(s) required by a protocol standard.

In another embodiment, the device receives a first packet carrying unfragmented data for an application, where the first packet has a first value in a first packet length field and successfully passes error checking. The device then receives a second packet carrying additional unfragmented data for the application, where the second packet has a second value in a packet length field that does not match the first value and fails error checking. The device may modify the second packet by setting the second packet length field to the first value and rerun the error-check on the modified second packet.

In a further embodiment, the device identifies unexpected values in a sequence number field and/or in a next expected sequence number field of a packet that failed error-checking. The device may set the values of the sequence number field and the next expected sequence number field to expected values and rerun the error-check on the modified second packet.

In a further embodiment, the device identifies an unexpected value of a length field in a received control packet. The device may then set the value of the length field to a value established by the protocol standard and rerun the error-check on the modified second packet.

In further embodiments, the device receives two sequential packets with detected errors, wherein a second packet is a retransmission of a first packet. The device compares the two sequential packets to identify differing bits. The device modifies the first or second packet to include one or more additional combinations of the differing bits and error-checks the modified packets with each combination of the differing bits. If a modified packet passes error checking, then process the modified packet.

BRIEF DESCRIPTION OF THE DRAWINGS

Having thus described the invention in general terms, reference will now be made to the accompanying drawings, wherein:

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

Bluetooth is a standardized protocol for sending and receiving data via a wireless link in the 2.4 GHz frequency range. Bluetooth networks use a master/slave model to control when and where devices can send data. Bluetooth Low Energy (BLE) uses the operating spectrum and the basic structure of the communication protocol from the classic Bluetooth protocol. However, BLE implements a lightweight Link Layer that provides ultra-low power idle mode operation, fast device discovery, and secure point-to-multipoint data transfers. As a result, BLE offers substantially lower peak, average, and idle-mode power consumption than classic Bluetooth. In a BLE topology, each slave communicates on a separate physical channel with the master.

The physical channels are sub-divided into time units known as events. Data is transmitted between LE devices in packets that are positioned in these events. There are two types of events: Advertising and Connection events. Devices that transmit advertising packets on the advertising PHY channels are referred to as advertisers. Devices that receive advertising packets on the advertising channels without the intention to connect to the advertising device are referred to as scanners.

Transmissions on the advertising PHY channels occur in advertising events. Devices that need to form a connection to another device listen for connectable advertising packets. Such devices are referred to as initiators. If the advertiser is using a connectable advertising event, an initiator may make a connection request using the same advertising PHY channel on which it received the connectable advertising packet. The advertising event is ended and a connection event begins if the advertiser receives and accepts the request for a connection. Once a connection is established, the initiator becomes the master device in what is referred to as a piconet and the advertising device becomes the slave device. Connection events are used to send data packets between the master and slave devices. Within a connection event, the master and slave alternate sending data packets using the same data PHY channel. The master initiates the beginning of each connection event and can end each connection event at any time.

Within a physical channel, a physical link is formed between a master and each slave. The physical link is used as a transport for one or more logical links that support asynchronous traffic. A link layer (LL) control protocol for the link and physical layers is carried over logical links in addition to user data. The Link Layer function uses the LL protocol to control the operation of devices in the piconet and provide services to manage the lower layers (PHY and LL).

The BLE system and the operation is described in the "Specification of the Bluetooth System, Specification Volume 6, Core System Package [Low Energy Controller volume]," dated Dec. 2, 2014 and published by the Bluetooth Special Interest Group ("the Bluetooth Low Energy Controller specification"), the disclosure of which is hereby incorporated by reference herein in its entirety.

Figure 1:
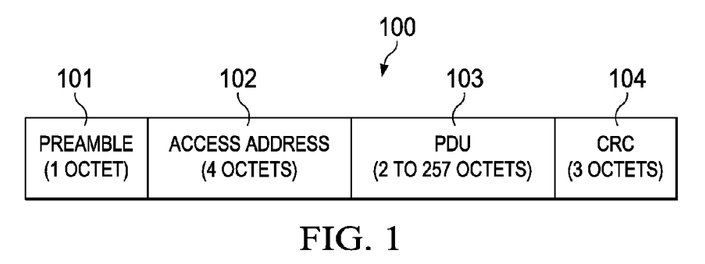
FIG. 1 illustrates the Link Layer packet format that is used for both advertising channel packets and data channel packets.

FIG. 1 illustrates the Link Layer packet format 100 that is used for both advertising channel packets and data channel packets. Each packet 100 consists of four fields: the Preamble 101, Access Address 102, Protocol Data Unit (PDU) 103, and Cyclic Redundancy Check (CRC) 104. The Preamble 101 is transmitted first, followed by the Access Address 102, followed by the PDU 103, and then the CRC 104. The Preamble 101 is one octet long, the Access Address 102 is four octets long, and the CRC is three octets long. The PDU length ranges from 2 to 257 octets. As a result, the packet 100 may vary in length from 80 bits (shortest possible) to 2120 bits (longest possible).

All Link Layer packets 100 have an eight-bit preamble 101 that is used in the receiver to perform frequency synchronization, symbol timing estimation, and Automatic Gain Control (AGC) training. In a data channel packet, the preamble 101 is either 10101010b or 01010101b, depending on first bit of the Access Address 102. If the first bit of the Access Address 102 is 1, then the preamble 101 is 01010101b, otherwise the preamble is 10101010b.

The Access Address 102 in data channel packets is different for each Link Layer connection between any two devices. The Access Address 102 is a random 32-bit value, generated by the initiator and sent in a connection request. The initiator is responsible for ensuring that the Access Address meets the requirements set forth in the Bluetooth specification.

At the end of every Link Layer packet 100 there is a 24-bit CRC 104 that is calculated over the PDU. If the PDU is encrypted, then the CRC is calculated after encryption of the PDU has been performed. The CRC polynomial has the form of: $x^{24}+x^{10}+x^9+x^6+x^4+x^3+x+1$.

Figure 2:
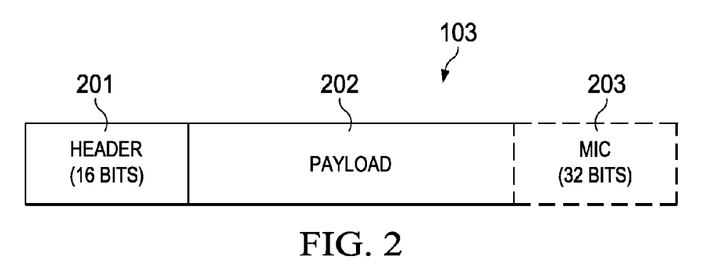
FIG. 2 illustrates the format of the data channel PDU, which has a sixteen-bit Header, a variable-size Payload, and a Message Integrity Check (MIC) field.

FIG. 2 illustrates the format of the data channel PDU 103, which has a sixteen-bit Header 201, a variable-size Payload 202, and may include a Message Integrity Check (MIC) field 203. The thirty-two-bit MIC field 203 is required for encrypted Link Layer connections with a data channel PDU having a non-zero length Payload 202 and shall be calculated as specified in the Bluetooth specification. An LL Data PDU is a data channel PDU that is used to send Logical Link Control and Adaptation Protocol (L2CAP) data. An LL Control PDU is a Data Channel PDU that is used to control the Link Layer connection.

Figure 3:
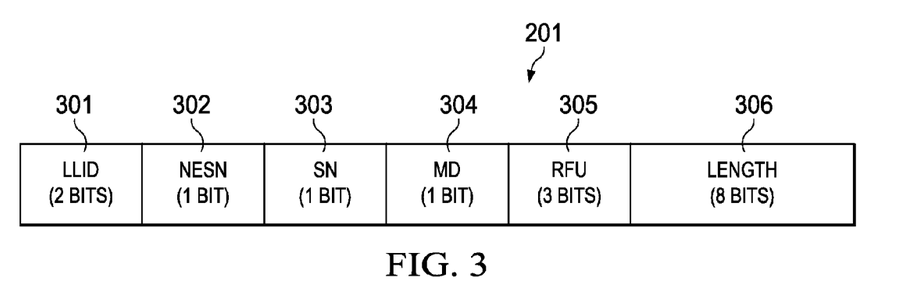
FIG. 3 illustrates the format of the data channel PDU Header, which consists of five standardized fields.

FIG. 3 illustrates the format of the data channel PDU Header 201, which consists of five standardized fields. LLID field 301 indicates whether the packet is a data PDU or a control PDU. The format of payload 202 is associated with the LLID field 301 of Header 201. If the LLID field 301 is 01b or 10b, then the data channel PDU Payload field 202 contains a data PDU. If the LLID field is 11b, then the data channel PDU Payload field contains a control PDU.

NESN field 302 is set to indicate the sequence number of next expected PDU. SN field 303 is set to indicate the sequence number of the current PDU. The one-bit SN and NESN fields 302, 303 are used for Link Layer acknowledgement and flow control and to determine if a received PDU has been resent or is new.

The MD bit 304 of the Header 201 is used to indicate that the device has more data to send. If neither device has set the MD bit, then the packet from the slave closes the connection event. If either or both of the devices have set the MD bit, the master may continue the connection event by sending another packet, and the slave listens after sending its packet. If a packet is not received from the slave by the master, the master will close the connection event. If a packet is not received from the master by the slave, the slave will close the connection event.

Reserved for Future Use (RFU) field 305 is set to zero on transmission and ignored upon receipt.

The Length field 306 indicates the length of the Payload 202 and MIC 203, if included. The Length field 306 may indicate a range of 0 to 255 octets. The Payload field 202 is less than or equal to 251 octets in length. The MIC field 203 is 4 octets in length.

In a BLE communication session, a received packet is rejected without doing CRC if there are errors in Access Address 102. If, however, Preamble 101 and Access Address 102 are correct, but the CRC 104 is in error, then the master will drop the connection interval if two consecutive packets have CRC errors. Because the connection interval is dropped and packets are retransmitted, power consumption at the slave increases every time the connection interval is dropped. This is not desirable since BLE is intended to support low power consumption devices. Embodiments described herein provide a method for a receiving device to handle received packets with CRC errors in a way that minimize the need to drop the connection interval.

When a received packet goes through the CRC process at the receiving device and the CRC indicates an error, there are a few actions that can be taken by the receiving device to correct easily identifiable errors in the received packet.

Check RFU bits.

Upon detection of a CRC error, the receiving device may check the RFU bits 305 in the header 201. If any RFU bit is not zero, then the receiving device resets all RFU bits 305 to zero and reruns the CRC process. If CRC checks correct on the repaired packet, then the packet is passed to the next process (e.g., decryption, etc.) in the receiving device.

Check Length field.

If the slave device has sent unfragmented data for the application that is running, and if the Length field 306 in the header 201 matches the previously sent packet, then the error causing the CRC error should be in a different portion of the PDU 103. To handle this scenario, the receiving device may use packet combining as described below to attempt to repair the received packet.

If the slave device has sent unfragmented data for the application that is running, but the Length field 306 not match the previously sent packet length and the LLID field 301 is the same (i.e., 01b or 10b), then the error is likely in the Length field. The receiving device may correct the Length field 306 bits and rerun the CRC process. For applications that require more than one packet, the master can estimate the size of the data packet that is expected based on previous history. If CRC checks correct, then the repaired packet is passed to the next process. Otherwise, the receiving device may use packet combining to attempt to repair the packet.

Check NESN and SN fields.

Assuming that no fragmentation is occurring in a data packet and the LLID 301 and Length 306 fields are the same as in previously sent packets, errors in the NESN 302 or SN 303 fields may be detected. For example, considering the following exchange between master and slave:

(1) Slave to Master: NESN=0, SN=0: master receives the packet correctly;
(2) Master to Slave: NESN=1, SN=0: slave receives the packet correctly;
(3) Slave to Master: NESN=1, SN=1: master receives the packet incorrectly with either NESN or SN or both in error.

Two scenarios are possible in this situation:
(a) The master thinks that the slave did not receive its packet correctly—(i.e., the slave should have sent NESN=0, SN=0). The master may set the NESN and SN fields to zero and rerun the CRC. If the CRC is correct on the repaired packet, then the master may pass the packet to other processes.
(b) The master thinks that the slave received the packet correctly. The master may set NESN=1, SN=1 and rerun CRC. If the CRC checks correctly, then the master may pass the repaired packet to other processes. Otherwise, the receiving device may use packet combining to attempt to repair the packet.

Control packet header.

If a control packet is received and fails CRC, the receiving device may attempt the following. If the control type and length of the packet do not match with what is specified in the standard, then the receiving device may adjust the Length field 306 to match the length of the received control packet. The device then reruns the CRC process on the repaired packet. If CRC checks correct, then the repaired packet is passed to the next process. Otherwise, the receiving device may use packet combining to attempt to repair the packet.

Packet combining.

The corrections described above may be used to handle errors that occur in the PDU Header 201. However, packet errors could occur in the Payload 202, MIC 203, and/or CRC 104. To handle these errors, the receiving device may use packet combining. It will be understood that packet combining may be used to detect and repair header errors as well.

In an example embodiment, the receiving device is capable of correcting up to two bit errors. It will be understood that other numbers of bits may be corrected; however, as the numbers of bits increases, so does the complexity of the packet combining process. The packet combining approach relies on the fact that the receiving device is receiving consecutive packet errors. Assuming that the device has already received a first packet in error and that the device was unable to detect and repair the error using one or more (or none) of the approaches described above, the first error packet is stored it. If the next received packet also has a bad CRC check, the following process may be used.

The receiving device compares the bits of the first error packet and the bits of the second error packet. If the first and second packet differ in just one place, then it is assumed that all of the error bits cannot be detected using packet combining (i.e., if there was only one error, then one of the packets should have passed CRC, so there is likely another error bit that is common to both packets).

If the first and second packets differ in two places, then there are two additional combinations of two bits for which CRC should be checked. As illustrated in Table 1, in order to differ by two bits, the first and second packet must be combinations of A-D or B-C. Any other combination (e.g., A-B, A-C, B-D, or C-D) would only allow detection of one differing bit (i.e., a first bit in both packets would have the same error, which is undetectable by packet comparison, and a second bit would be correct in one packet but erroneous in the other packet).

TABLE 1

| Combination | Bit 1 | Bit 2 |
|---|---|---|
| A | 0 | 0 |
| B | 0 | 1 |
| C | 1 | 0 |
| D | 1 | 1 |

After identifying the possible error bits, the receiving device modifies the packet using the remaining two-bit combinations and reruns CRC. If CRC checks correct for one of the other combinations, then the repaired packet is forwarded to the next process. Otherwise, the packet is dropped if CRC fails for each combination (i.e., there is likely an undetected third bit in error).

It will be understood that three or more bit errors may be detected and correction may be attempted using packet combining. For example, if three bits differ between the first and second error packets, then there are six additional combinations to try to attempt to resolve the error. However, due to the time and overhead required to run CRC on multiple variations of the error packets, it may be more efficient to allow the connection to drop and be reestablished.t errors).

The number of CRC checks that will be required to correct n-bit mismatches is:

$$CRCn = 2^n - 2 \quad \text{(Eq. 1)}$$

If the bit-error-rate is BER and the length of packet is L. Then the packet error rate without packet combining may be given as:

$$P_{e\text{-}noc} = 1 - (1-BER)^{(L+5)*8} \quad \text{(Eq. 2)}$$

Two consecutive packets in errors occur with probability:

$$P_{cons\text{-}e\text{-}noc} = P_{e\text{-}noc}^2 \quad \text{(Eq. 3)}$$

With packet combining, for two bit errors, the assumption is that there is at most one error in each packet and the error occurs in different places in each packet. Hence, for the first packet, a single bit-error in the packet, the probability is:

$$P_{e\text{-}wc} = (L+5)*8*BER*(1-BER)^{(L+5)*8-1} \quad \text{(Eq. 4)}$$

Thus, for two consecutive packets to not be in error, one of the following events has to happen:
neither packet is in error,
both packets have at most one error in different places, or
one packet has one bit in error and the other does not.
Hence:

$$P_{cons\text{-}e\text{-}wc} = 1 - \{(1-BER)^{(L+5)*8}*(1-BER)^{(L+5)*8} + 2*(1-BER)^{(L+5)*8}*(L+5)*8*BER*(1-BER)^{(L-5)*8-1} + (L+5)*8*BER*(1-BER)^{(L+5)*8-1}*((L+5)*8-1)*BER*(1-BER)^{(L+5)*8-1}\} \quad \text{(Eq. 5)}$$

For higher error correction capability, the probability of two consecutive packets in error is reduced further; however, CRC checks will also increase exponentially with n.

Figure 4:
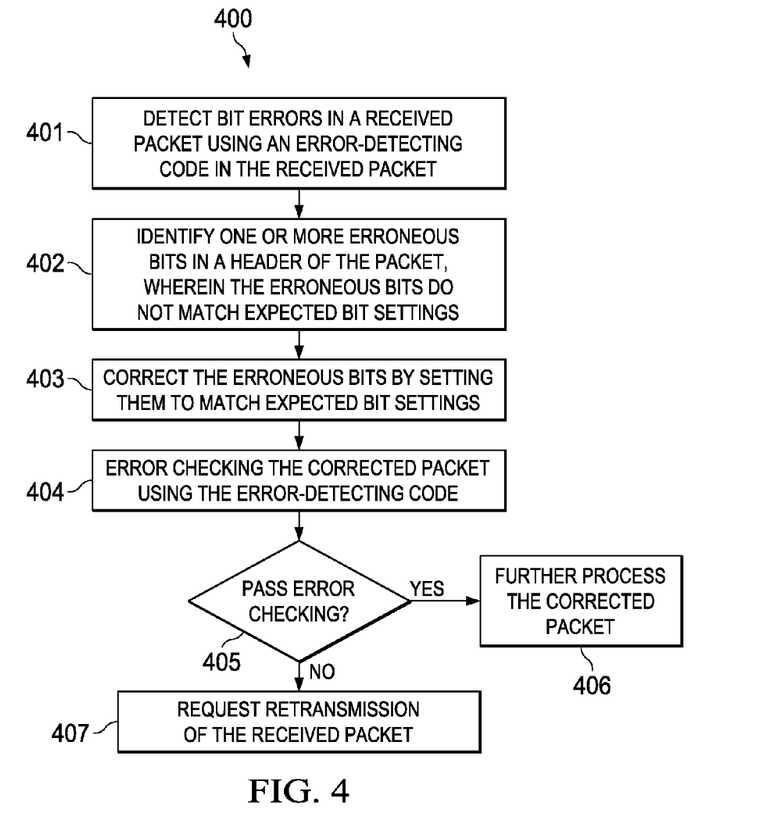
FIG. 4 is a flowchart illustrating a process for correcting errors in received packets according to one embodiment

FIG. 4 is a flowchart illustrating a process 400 for correcting errors in received packets according to one embodiment. Process 400 may be performed by any device that receives data packets from one or more other devices. In one embodiment, process 400 is used to process packets received in a device adapted to communicate in a master-slave relationship with remote devices, such as devices communicating using a Bluetooth low energy link layer. In step 401, bit errors are detected in a received packet using an error-detecting code carried in the received packet. The error-detecting code may be, for example, a CRC code.

In step 402, one or more erroneous bits are identified in a header of the packet. The erroneous bits are identified because they do not match expected bit settings, such as bit values established in a protocol standard or in previously received packets. In step 403, the erroneous bits in the packet are corrected by setting the erroneous bits to match the expected bit settings. For example, the erroneous bits may be set to values established by the protocol standard for certain fields or to values detected in previously received packets.

In one embodiment, the erroneous bits are located in a reserved field of the packet header. The device attempts to correct the erroneous bits in step 403 by setting all bits in the reserved field to values set by the protocol standard. These bits values may be all zeros, all ones, or some other combination of values.

In another embodiment, the device receives a first packet carrying unfragmented data for an application. The first packet has a first value in a first packet length field and passes error checking. The device then receives a second packet carrying additional unfragmented data for the application and having a second value in a packet length field that does not match the first value. A failed error-check is detected in step 401 for the second packet. The device may attempt to correct the erroneous bits in step 403 by modifying the second packet to set the second packet length field to the first value.

In a further embodiment, unexpected values are identified at step 402 in a sequence number field and in a next expected sequence number field of a received packet that failed error-checking in step 401. The device may attempt to correct the erroneous bits in step 403 by setting the values of the sequence number field and the next expected sequence number field to expected values. The expected values may be determined based upon values that would have been sent if the remote device had received a previous packet correctly or incorrectly.

In a further embodiment, an unexpected value of a length field in a received control packet is identified at step 402. The device may attempt to correct the erroneous bits in step 403 by setting the value of the length field to a value established by the protocol standard.

In step 404, the corrected packet is error checked using the error-detecting code. In step 405, the error checking on the corrected packet is evaluated. If error checking passed, then in step 406 the corrected packet is further processed by the device, such as decryption processing, etc. If error checking does not pass, then in step 407 the device may request retransmission of the received packet from the remote device.

Figure 5:
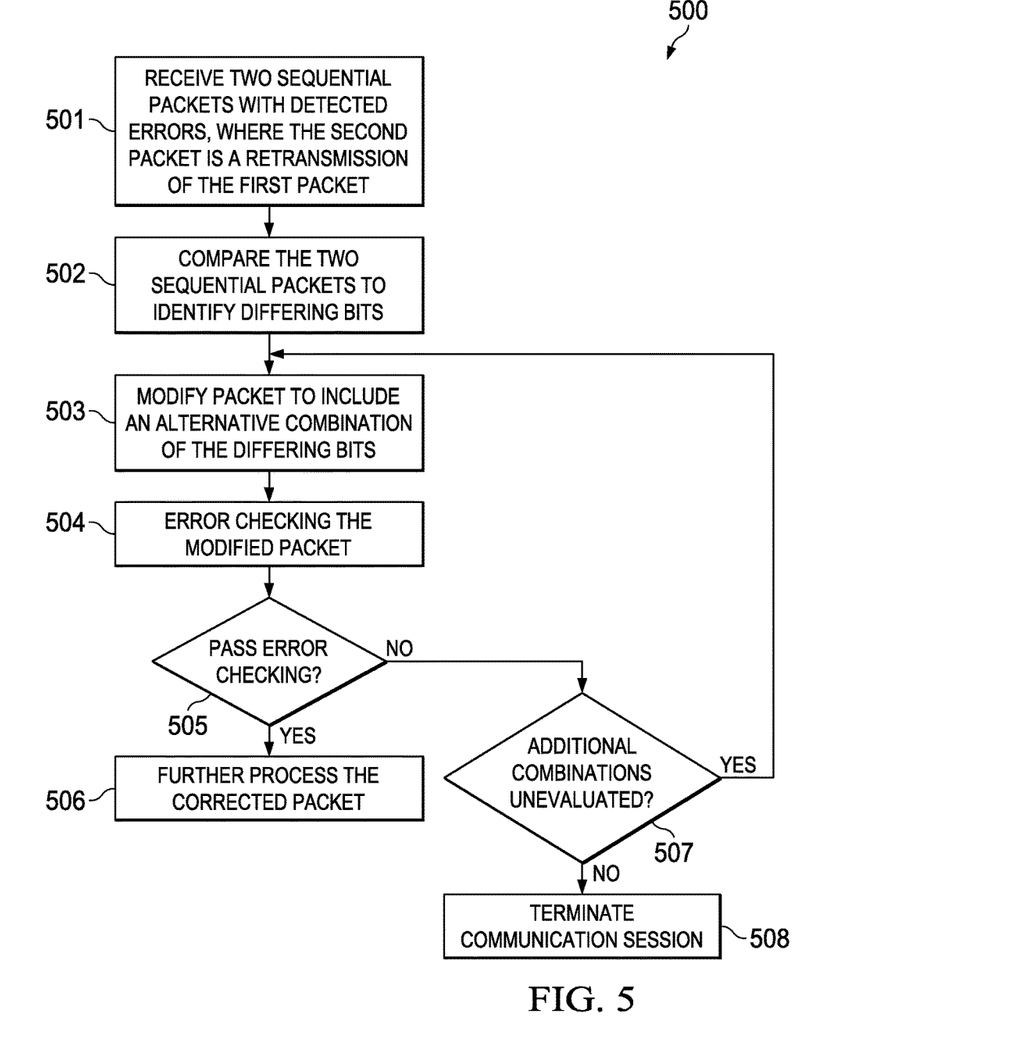
FIG. 5 is a flowchart illustrating a process for correcting errors in received sequential packets according to one embodiment.

FIG. 5 is a flowchart illustrating a process 500 for correcting errors in received sequential packets according to one embodiment. Process 500 may be performed by any device that receives data packets from one or more other devices. In one embodiment, process 500 is used to process packets received in a device adapted to communicate in a master-slave relationship with remote devices, such as devices communicating using a Bluetooth low energy link layer. In step 501, the device receives two sequential packets with detected errors, wherein a second packet is a retransmission of a first packet.

In step 502, the two sequential packets are compared to identify differing bits. In step 503, either packet is modified to include one or more additional combinations of the differing bits. In step 504, the modified packet is error checked. In step 505, the error checking on the modified packet is evaluated.

If the modified packet passes error checking, then the modified packet is further processed in step 506. If the modified packet does not pass error checking, then at step 507 the process determines if additional combinations of the differing bits are still unevaluated.

If additional combinations of the differing bits have not yet been evaluated, then the process returns to step 503 and the packet is modified to include another alternative combination of the differing bits. The process continues evaluating all of the possible alternative combinations of the differing bits until a modified packet passes error checking or until no more combinations remain to be evaluated. If all of the possible alternative combinations of the differing bits have been evaluated, then the process moves to step 508 and the communication session with the other device is terminated. In other embodiments, depending upon the protocol standard in use, a second retransmission of the packet may be requested instead of terminating the communication session.

In one embodiment, if two differing bits are detected between the first and second packets at step 502, then there are four possible alternate combinations of the two differing bits. Two of those combinations have already failed error detection in step 501. Accordingly, in step 503, either packet is modified to include a third combination of the differing bits. The modified packet with the third combination of bits is error-checked in step 504. If the modified packet with the third combination of bits fails error-checking, then step 507 determines that a fourth alternative combination of bits has not been evaluated. The packet is further modified at step 503 to include the fourth combination of bits. The modified packet with the fourth combination of bits is again error-checked at step 504. If the fourth combination of bits fails to pass error checking, then the process may terminate the communication session since no more combinations of bits remain to be evaluated.

In other embodiments, a device may detect and attempt to correct three or more differing bits. For example, if three differing bits are detected, then there are six (i.e., $2^3-2$) additional combinations of bits to evaluate.

Figure 6:
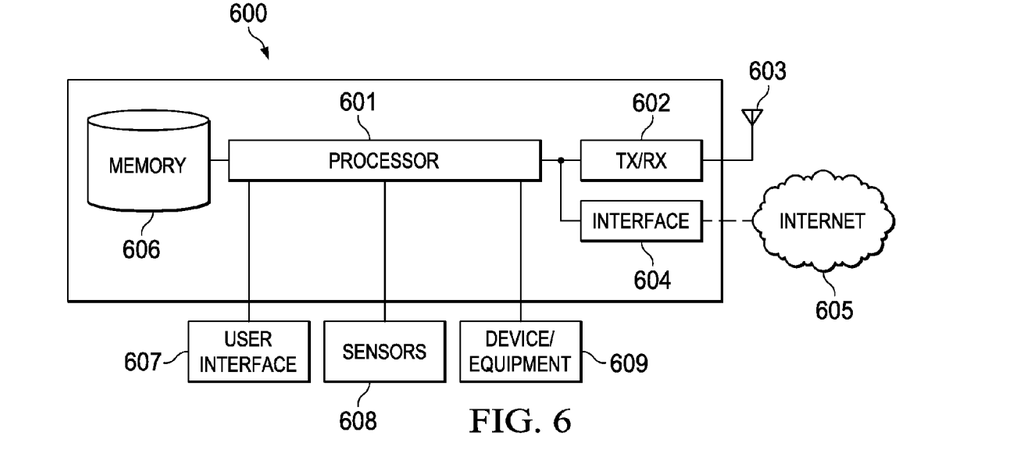
FIG. 6 is a block diagram of an exemplary embodiment of a device adapted to implement embodiments of the invention.

FIG. 6 is a block diagram of an exemplary embodiment of a device 600 adapted to implement embodiments of the invention. Device 600 may be used as a master or slave device and/or a sending or receiving device in a BLE system, for example. Processor 601 processes data exchanged with other BLE devices via transceiver 602 and antenna 603. Device 600 may access the Internet or other network 605 via wired interface 604. Processor 601 may be a software, firmware, or hardware based device or a combination thereof. Processor 601 may also generate and process messages sent to, and received from, another device, such as data channel PDUs as described herein.

Memory 606 may be used to store data and control packets and other parameters used in a BLE system. Memory 606 may also be used to store computer program instructions, software and firmware used by processor 601. It will be understood that memory 606 may be any applicable storage device, such as a fixed or removable RAM, ROM, flash memory, or disc drive that is separate from or integral to processor 601.

Device 600 may be coupled to other devices, such as user interface 607, sensors 608, or other devices or equipment 609. Sensors 608 may be used, for example, to monitor environmental or physical conditions or mechanical or electrical states of a device or equipment 609.

Many of the functions described herein may be implemented in hardware, software, and/or firmware, and/or any combination thereof. When implemented in software, code segments perform the necessary tasks or steps. The program or code segments may be stored in a processor-readable, computer-readable, or machine-readable medium. The processor-readable, computer-readable, or machine-readable medium may include any device or medium that can store or transfer information. Examples of such a processor-readable medium include an electronic circuit, a semiconductor memory device, a flash memory, a ROM, an erasable ROM (EROM), a floppy diskette, a compact disk, an optical disk, a hard disk, a fiber optic medium, etc.

The software code segments may be stored in any volatile or non-volatile storage device, such as a hard drive, flash memory, solid state memory, optical disk, CD, DVD, computer program product, or other memory device, that provides computer-readable or machine-readable storage for a processor or a middleware container service. In other embodiments, the memory may be a virtualization of several physical storage devices, wherein the physical storage devices are of the same or different kinds. The code segments may be downloaded or transferred from storage to a processor or container via an internal bus, another computer network, such as the Internet or an intranet, or via other wired or wireless networks.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. A method, comprising:
   in a device adapted to communicate in a master-slave relationship with remote devices,
   detecting the presence of bit errors in a received packet using an error-detecting code carried in the received packet;
   identifying one or more erroneous bits in a header of the packet, wherein the one or more erroneous bits do not match expected bit settings established in a protocol standard or in previously received packets;
   correcting the one or more erroneous bits in the packet by setting the erroneous bits to match the expected bit settings; and
   error-checking a corrected packet using the error-detecting code;
   further comprising:
   if the corrected packet passes the error checking, processing the corrected packet; and
   if the corrected packet fails to pass the error checking, requesting retransmission of the received packet from the remote device.

2. A method, comprising:
   in a device adapted to communicate in a master-slave relationship with remote devices,
   detecting the presence of bit errors in a received packet using an error-detecting code carried in the received packet;
   identifying one or more erroneous bits in a header of the packet, wherein the one or more erroneous bits do not match expected bit settings established in a protocol standard or in previously received packets;
   correcting the one or more erroneous bits in the packet by setting the erroneous bits to match the expected bit settings; and
   error-checking a corrected packet using the error-detecting code;
   wherein the erroneous bits are located in a reserved field of the header, the method further comprising:
   setting all bits in the reserved field to zero.

3. A method, comprising:
   in a device adapted to communicate in a master-slave relationship with remote devices,
   detecting the presence of bit errors in a received packet using an error-detecting code carried in the received packet;
   identifying one or more erroneous bits in a header of the packet, wherein the one or more erroneous bits do not match expected bit settings established in a protocol standard or in previously received packets;
   correcting the one or more erroneous bits in the packet by setting the erroneous bits to match the expected bit settings; and error-checking a corrected packet using the error-detecting code;
further comprising:
receiving a first packet carrying unfragmented data for an application, the first packet having a first value in a first packet length field;
confirming a successful error-check for the first packet;
receiving a second packet carrying additional unfragmented data for the application, the second packet having a second value in a packet length field that does not match the first value;
detecting a failed error-check for the second packet;
modifying the second packet by setting the second packet length field to the first value; and
error-checking the modified second packet using the error-detecting code.

4. The method of claim 3, further comprising:
identifying unexpected values in a sequence number field and in a next expected sequence number field of a packet that failed error-checking; and
setting the values of the sequence number field and the next expected sequence number field to expected values.

5. The method of claim 3, further comprising:
identifying unexpected value of a length field in a received control packet; and
setting the value of the length field to a value established by the protocol standard.

6. A method, comprising:
in a device adapted to communicate in a master-slave relationship with remote devices,
receiving two sequential packets with detected errors, wherein a second packet is a retransmission of a first packet;
comparing the two sequential packets to identify differing bits;
modifying the first or second packet to include one or more additional combinations of the differing bits;
error-checking modified packets with each combination of the differing bits; and
if a modified packet passes error checking, then processing the modified packet.

7. The method of claim 6, wherein the device communicates using a Bluetooth low energy link layer, and wherein a cyclic redundancy check (CRC) is used to identify errors.

8. The method of claim 6, wherein two differing bits are detected between the first and second packets, the first packet having a first combination of bits, the second packet having a second combination of bits, the method further comprising:
modifying the differing bits in the first or second packet to include a third combination of bits; and
error-checking the modified packet with the third combination of bits.

9. The method of claim 8, further comprising:
if the modified packet with the third combination of bits fails error-checking, then modifying the differing bits in the first or second packet to include a fourth combination of bits; and
error-checking the modified packet with the fourth combination of bits.

10. The method of claim 6, wherein if n differing bits are detected, then no more than ($2^n-2$) additional combinations of differing bits are evaluated by the device.

11. A device, comprising:
a circuit for receiving signals from another device using a Bluetooth low energy link layer;
a memory for storing received packet parameters; and
a processor adapted to perform operations on packets received from the other device, the processor operating to:
detect the presence of bit errors in a received packet using cyclic redundancy check (CRC) bits carried in the received packet;
identify one or more erroneous bits in a header of the packet, wherein the one or more erroneous bits do not match expected bit settings established in a protocol standard or in previously received packets;
correct the one or more erroneous bits in the packet by setting the erroneous bits to match the expected bit settings; and
error-check a corrected packet using the CRC bits;
wherein the processor is further adapted to:
if the corrected packet passes the error checking, process the corrected packet; and
if the corrected packet fails to pass the error checking, request retransmission of the received packet from the other device.

12. A device, comprising:
a circuit for receiving signals from another device using a Bluetooth low energy link layer;
a memory for storing received packet parameters; and
a processor adapted to perform operations on packets received from the other device, the processor operating to:
detect the presence of bit errors in a received packet using cyclic redundancy check (CRC) bits carried in the received packet;
identify one or more erroneous bits in a header of the packet, wherein the one or more erroneous bits do not match expected bit settings established in a protocol standard or in previously received packets;
correct the one or more erroneous bits in the packet by setting the erroneous bits to match the expected bit settings; and
error-check a corrected packet using the CRC bits;
wherein the erroneous bits are located in a reserved field of the header, the processor is further adapted to:
set all bits in the reserved field to zero.

13. A device, comprising:
a circuit for receiving signals from another device using a Bluetooth low energy link layer;
a memory for storing received packet parameters; and
a processor adapted to perform operations on packets received from the other device, the processor operating to:
detect the presence of bit errors in a received packet using cyclic redundancy check (CRC) bits carried in the received packet;
identify one or more erroneous bits in a header of the packet, wherein the one or more erroneous bits do not match expected bit settings established in a protocol standard or in previously received packets;
correct the one or more erroneous bits in the packet by setting the erroneous bits to match the expected bit settings; and
error-check a corrected packet using the CRC bits;
wherein the processor is further adapted to:
receive a first packet carrying unfragmented data for an application, the first packet having a first value in a first packet length field;
confirm a successful error-check for the first packet;

receive a second packet carrying additional unfragmented data for the application, the second packet having a second value in a packet length field that does not match the first value;

detect a failed error-check for the second packet;

modify the second packet by setting the second packet length field to the first value; and error-check the modified second packet using the error-detecting code.

14. The device of claim 13, wherein the processor is further adapted to:

identify unexpected values in a sequence number field and in a next expected sequence number field of a packet that failed error-checking; and set the values of the sequence number field and the next expected sequence number field to expected values.

15. The device of claim 13, wherein the processor is further adapted to:

identify unexpected value of a length field in a received control packet; and set the value of the length field to a value established by the protocol standard.

16. A device, comprising:

a circuit for receiving signals from another device using a Bluetooth low energy link layer;

a memory for storing protocol data unit (PDU) parameters; and a processor adapted to perform operations on the signals sent to or received from the other device, the processor operating to:

receive two sequential packets with detected errors, wherein a second packet is a retransmission of a first packet;

compare the two sequential packets to identify differing bits;

modify the first or second packet to include one or more additional combinations of the differing bits;

error-check modified packets with each combination of the differing bits; and if a modified packet passes error checking, then process the modified packet.

17. The device of claim 16, wherein two differing bits are detected between the first and second packets, the first packet having a first combination of bits, the second packet having a second combination of bits, and the processor further adapted to:

modify the differing bits in the first or second packet to include a third combination of bits;

error-check the modified packet with the third combination of bits;

if the modified packet with the third combination of bits fails error-checking, then modify the differing bits in the first or second packet to include a fourth combination of bits; and error-check the modified packet with the fourth combination of bits.

* * * * *